US009047950B2

(12) United States Patent  (10) Patent No.: US 9,047,950 B2
Amiri et al.  (45) Date of Patent: Jun. 2, 2015

(54) READ-DISTURBANCE-FREE NONVOLATILE CONTENT ADDRESSABLE MEMORY (CAM)

(71) Applicant: THE REGENTS OF THE UNIVERSITY OF CALIFORNIA, Oakland, CA (US)

(72) Inventors: Pedram Khalili Amiri, Los Angeles, CA (US); Richard Dorrance, Santa Monica, CA (US); Dejan Markovic, Los Angeles, CA (US); Kang L. Wang, Santa Monica, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 102 days.

(21) Appl. No.: 14/014,783

(22) Filed: Aug. 30, 2013

(65) Prior Publication Data

US 2014/0071728 A1  Mar. 13, 2014

Related U.S. Application Data

(60) Provisional application No. 61/699,713, filed on Sep. 11, 2012.

(51) Int. Cl.
*G11C 15/02* (2006.01)
*G11C 15/04* (2006.01)
(Continued)

(52) U.S. Cl.
CPC ............ *G11C 15/02* (2013.01); *G11C 11/5607* (2013.01); *G11C 13/004* (2013.01); *G11C 15/046* (2013.01)

(58) Field of Classification Search
CPC .. G11C 15/02; G11C 15/046; G11C 11/5607; G11C 13/004
USPC ............. 365/50, 158, 226, 49.1, 49.17, 49.18
IPC .............. G11C 15/02, 15/046, 11/5607, 13/004
See application file for complete search history.

(56) References Cited

U.S. PATENT DOCUMENTS 8,023,299 B1 *   9/2011   Gharia ......................... 365/49.1
2008/0084724 A1 *   4/2008   Nozieres et al. ................ 365/50
(Continued)

FOREIGN PATENT DOCUMENTS

WO   2012/159078 A2   11/2012

OTHER PUBLICATIONS

J. G. Alzate, P. Khalili Amiri, et al., "Voltage-Induced Switching of Nanoscale Magnetic Tunnel Junctions," in 56th Conference on Magnetism and Magnetic Materials Scottsdale, Arizona, 2011, pp. EG-11.
W.G. Wang, et al., "Electric-field-assisted switching in magnetic tunnel junctions," Nat Mater, vol. 11, pp. 64-68, 2012.
(Continued)

*Primary Examiner* — Richard Elms
*Assistant Examiner* — Mohammed A Bashar
(74) *Attorney, Agent, or Firm* — John P. O'Banion

(57) ABSTRACT

Voltage controlled magnetoelectric tunnel junction (MEJ) based content addressable memory is described which provides efficient high speed switching of MEJs toward eliminating any read disturbance of written data. Each cell of said CAM having two MEJs and transistor circuitry for performing a write at voltages of a first polarity, and reads at voltages of a second polarity. If the data searched does not equal the data written in the CAM, then the match line state is changed.

20 Claims, 13 Drawing Sheets

(51) Int. Cl.
*G11C 11/56* (2006.01)
*G11C 13/00* (2006.01)

(56) References Cited

U.S. PATENT DOCUMENTS

2008/0232148 A1* 9/2008 Yabe .......................... 365/49.1
2010/0110744 A1* 5/2010 El Baraji et al. ............. 365/50

OTHER PUBLICATIONS

Y. Shiota, et al., "Induction of coherent magnetization switching in a few atomic layers of FeCo using voltage pulses," Nat Mater, vol. 11, pp. 39-43, 2012.

Pagiamtzis, et al. "Content-Addressable Memory (CAM) Circuits and Architectures: A Tutorial and Survey," IEEE Journal of Solid-State Circuits, vol. 41, No. 3, Mar. 2006.

* cited by examiner

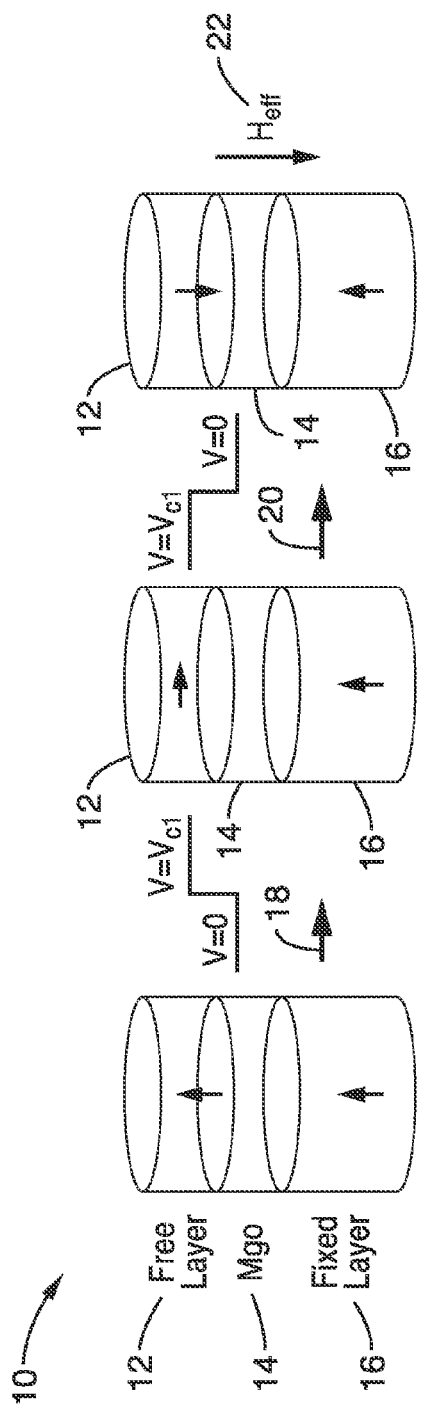
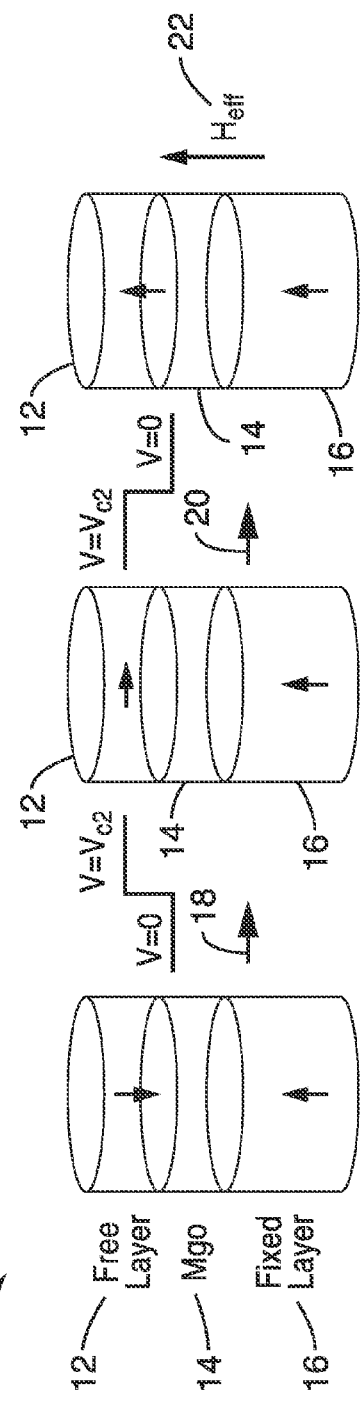

READ-DISTURBANCE-FREE NONVOLATILE CONTENT ADDRESSABLE MEMORY (CAM)

CROSS-REFERENCE TO RELATED APPLICATIONS

This application is a nonprovisional of U.S. provisional patent application Ser. No. 61/699,713 filed on Sep. 11, 2012, incorporated herein by reference in its entirety.

STATEMENT REGARDING FEDERALLY SPONSORED RESEARCH OR DEVELOPMENT

This invention was made with Government support under HR0011-10-0-0153, awarded by the U.S. Department of Defense, Defense Advanced Research Projects Agency. The Government has certain rights in the invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to magnetic random access memory (MRAM), and more particularly to read-disturbance free content addressable memory (CAM) using voltage controlled magneto-electric tunnel junctions (MEJs).

2. Description of Related Art

Memory devices with ever increasing densities, speeds and reliability are sought by the electronics industry. This demand applies to regular memory devices as well as to more specialized memories, such as content addressable memories (CAMs). Memories configured as CAMs are particularly well-suited in numerous applications, including search-based systems, such as cache controllers, Ethernet routing, data compression, pattern recognition, and so forth.

Presently available CAMs are typically implemented using SRAM-based data storage. However, static RAMs consume a large amount of power, and data is lost when the power is lost (i.e., volatile).

Toward mitigating these problems with SRAM CAMs, spin-transfer torque (STT) MTJs have recently been used to construct nonvolatile CAMs. Spin transfer torque (STT) techniques use spin-aligned ("polarized") electrons to directly torque the domains. In particular, if the electrons flowing into a layer are forced to change their spin, this will develop a torque that will be transferred to the nearby layer. The use of currents for writing STT-RAM, however, still involves substantial energy dissipation, and provides a limited memory array density since each magnetic bit requires a large access transistor to drive its large write current, which also limits its scalability. By using a nonvolatile MRAM memory element, static power dissipation can be almost entirely eliminated by cutting the power supply during idle periods.

However, despite their area and energy benefits, the speed and reliability of these CAMs using STT MTJ is limited by their search noise margin, which is to say their noise margin when reads are performed during a search.

Accordingly, a need exists for a non-volatile CAM with a high search noise margin, a high density, and low power dissipation in both static and active operation. The present invention fulfills these needs and others while overcoming many shortcomings of previous CAM devices.

BRIEF SUMMARY OF THE INVENTION

A CAM comprising voltage controlled magneto-electric tunnel junctions (MEJs) is described which provides high performance read-disturbance-free operation. The voltage controlled MEJ CAM of the present invention eliminates the performance-reliability trade-off currently associated with bit readout during searching. Utilizing MEJ devices in a content addressable memory has a number of advantages.

Magnetic Random Access Memory (MRAM) has generally been implemented with a magnetic-field-controlled or electric-current-controlled write mechanism. Data within an MRAM is not stored as electric charge or current flows, as in a conventional RAM, but instead by magnetic storage elements formed from ferromagnetic plates, separated by insulating material. In a magnetoresistive RAM, reading is performed in response to measuring the electrical resistance of the cell, which changes due to the orientation of the fields in the two plates. Data writes are performed by inducing a magnetic field in response to current through write lines to change magnetic orientation.

A prior patent application of the Applicant describes a voltage-controlled (i.e., electric-field-controlled) magneto-electric random access memory (MeRAM) using MEJs with a voltage-controlled magnetic anisotropy (rather than STT) switching mechanism, where information is written into the bit using pulsed voltages, rather than currents. MeRAM is nonvolatile, very dense, fast, and extremely low power. MeRAM offers a superior scaling behavior for energy and density, compared to STT-RAM, due to the fact that it uses voltages, rather than currents, to write information into the memory bits. MeRAM can provide high density memories with low power, yet it also can be subject to data disturbance during read operations, and it would be beneficial to increase the speed of read and write operations.

It should be appreciated, that when using traditional device technology in a CAM, preventing an unintentional write during read operations requires that sensing voltage/current has to be much lower than the write voltage/current threshold. However, in the present invention the CAM device has an almost unlimited search noise threshold, without constraining voltage levels and pulse lengths during the search.

In addition, the inventive voltage controlled MEJ based CAMs have a pipelined match-line structure, in which static leakage power is effectively eliminated, thus optimizing energy efficiency.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 1A and FIG. 1B are schematics of voltage-induced switching of a voltage controlled MEJ from P to AP and from AP to P.

DETAILED DESCRIPTION OF THE INVENTION

Figure 2:
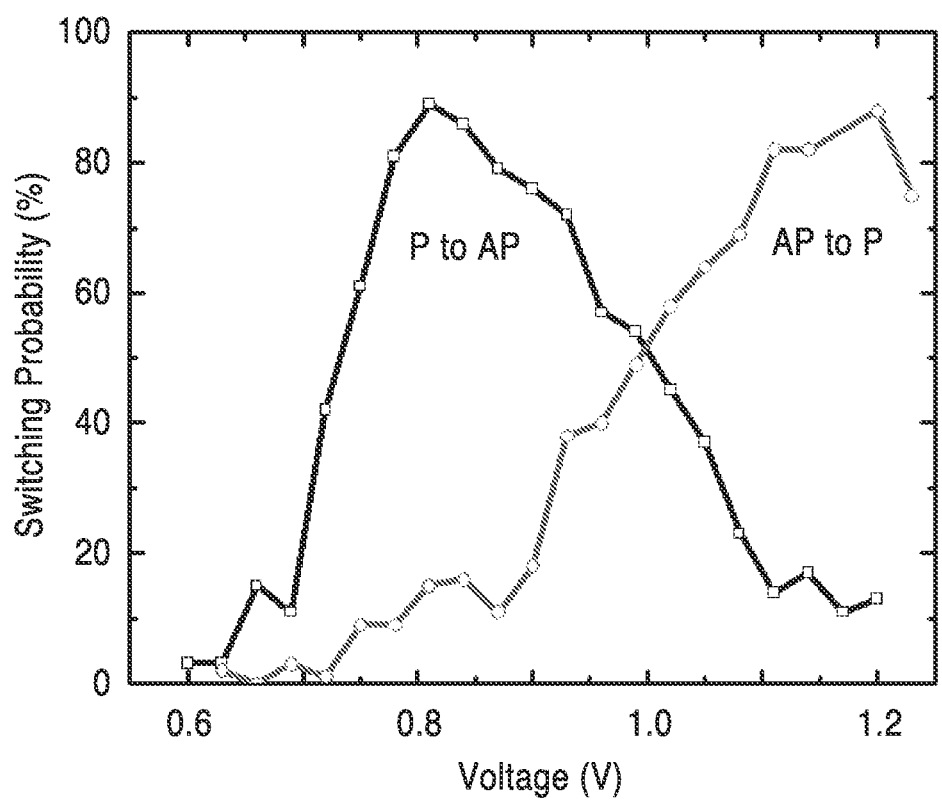
FIG. 2 is a graph of switching probability in response to pulse voltage for an MEJ using voltage controlled magnetic anisotropy (VCMA).

1. Voltage Controlled MEJs Using VCMA.

The present invention relies on using MEJs, with a voltage-controlled magnetic anisotropy (VCMA) switching mechanism (rather than STT), as the memory element in nonvolatile CAMs.

The voltage-controlled magnetic anisotropy (VCMA) performs switching without relying on the flow of large (e.g., sufficient to change MEJ state) electric charge currents either through the device or through a conductor placed close to the device, as they rely on the VCMA effect for switching. Information is stored in the state of a magnetic bit (i.e., in a free layer, FL). The magnetization of the FL can be switched from one state to another using an applied voltage, such as either solely in response to the applied electric field, or to assist in or be utilized in conjunction with a magnetic field or current-induced switching process.

The voltage controlled MEJ comprises a combination of at least two ferromagnetic layers (FM) separated by a dielectric which blocks the bulk of current passage. The DE layer is not sufficiently conductive to allow changing the state of the VCMA switch, or writing the state of an MEJ bit based on current flow.

The two FM layers comprise at least an FM fixed layer and an FM free layer. Material, shape and thickness of the FM free layer is selected to have particular in-plane (IP) and out-of-plane (OOP) anisotropies. The OOP anisotropy of said FM free layer is affected by interface properties between the FM layers and the DE layer, and is controlled by voltages applied across the DE layer as an applied voltage, giving rise to a voltage-controlled magnetic anisotropy (VCMA) effect which switches magnetization orientation of the FM free layer in the apparatus. Magnetization of the free layer is switchable between two magnetization orientation states that are either in-plane (IP) or out-of-plane (OOP). These magnetization orientation states are parallel (P) and anti-parallel (AP) with respect to magnetization orientation of said FM fixed layer. Data is written and retained in the MEJs of a memory array by changing the magnetization states (AP or P) of the MEJs in response to voltage application. A significant flow of current is not required to perform the switching, although a small bias/leakage current (e.g., <10 µA) will be present.

The fixed layer may or may not be configured for exchange using an anti-ferromagnetic film (e.g., Platinum-Manganese (PtMn) or Iridium-Manganese (IrMn)). It may also be replaced in some embodiments by a synthetic anti-ferromagnet (SAF) material.

It should be appreciated that additional layers may be present without departing from the present invention. For example, the fixed layer may be augmented by adding one or more ferromagnetic semi-fixed layers separated by dielectric layers. In addition, the free layer and fixed layers may each comprise a combination of ferromagnetic and non-magnetic layers, and may be capped or seeded by other non-magnetic layers.

Voltage-Controlled MEJs are switched using voltage-controlled magnetic anisotropy (VCMA) by putting their free layer into a meta-stable intermediate state using an applied voltage pulse. When the voltage is removed, the free layer relaxes to either the parallel (P) or anti-parallel (AP) state depending upon the overall magnetic field acting on the free layer.

FIG. 1A and FIG. 1B illustrate an embodiment 10 of MEJ switching performed from P to AP in FIG. 1A and for AP to P in FIG. 1B for out-of-plane magnetization (vertical). Each of the figures depict transition from an initial state, to an intermediate state to a final state. Similar figures could be shown for in-plane-magnetization (horizontal), as it operates in the same manner. In each of FIGS. 1A and 1B, magnetization is forced from a stable state (shown at the left of the figure) into a meta-stable state (shown in figure center) by an applied pulse voltage. Upon relaxing, the applied voltage magnetization relaxes (shown at the right) to a (similar or different) stable state. In some cases, the initial equilibrium state and the end state may include both an out-of-plane component and an in-plane component due to the compensation between in-plane shape anisotropy and out-of-plane interfacial anisotropy.

More particularly, each of the figures depict a free layer 12, in relation to a dielectric layer 14 (e.g., MgO) and a fixed layer 16. The free layer 12 and fixed layer 16 are ferromagnetic (FM) materials, such as those comprising Fe, Co, CoFe, or CoFeB. A dielectric (DE) tunnel barrier 14 comprises dielectric material, such as those comprising MgO, interposed between said FM free layer and FM fixed layer.

It should be noted that typically a higher Fe content in the CoFeB ferromagnet leads to larger perpendicular anisotropy. Thus, the present invention allows selecting the level of perpendicular anisotropy by adjusting composition, shape and thickness of the ferromagnet.

In addition, the device can optionally incorporate one or more semi-fixed layers, describing a layer in which magnetization can be rotated for some applied voltages, but not for others. By incorporating a semi-fixed layer, the device operates in a set/reset mode, in which a first voltage is applied to change the magnetization state from reset to set, but subsequent application will not change the device state. The application of a larger voltage is used to return device state to the reset condition. Still further, the fixed and semi-fixed layers may or may not be exchange-coupled through a metallic barrier film (e.g., Ruthenium (Ru)). They can also be separated by an ordinary metal (e.g., Tantalum (Ta)) or dielectric material and thus only be dipole-coupled.

It should be appreciated that each of the free and fixed layers may themselves comprise several sub-layers, that acting in combination provide the free or fixed layer functionality. An example is a synthetic antiferromagnetically coupled free or fixed layer, such as two CoFe or CoFeB films which are exchange-coupled through a thin metallic barrier such as Ruthenium (Ru). These additional layers, for example, can be seen in FIG. 9. One of ordinary skill in the art will recognize that many such combinations can be configured to provide a fixed layer and a free layer. The free layer composition and capping (or seed) layers can be selected, such as to induce a large perpendicular magnetic anisotropy. Examples of capping or seed layer materials include Tantalum (Ta), Ruthenium (Ru), Hafnium (Hf), Vanadium (V), and Palladium (Pd), and composition examples include Fe-rich films such as $Co_{40}Fe_{40}B_{20}$ or $Co_{20}Fe_{60}B_{20}$. It should be appreciated that the above are provided by way of example only, and the invention is by no means limited to these materials or compositions as it can be practiced across a range of other materials.

The ferromagnetic free and fixed layers have an in-plane (IP) and an out-of-plane (OOP, also referred to as perpendicular) magnetic anisotropy. The OOP anisotropy is affected by the FM/DE interface properties (as well as the cap or seed layer materials depending on the materials), and can be controlled by electric fields (i.e., voltages) applied across the DE layer, thereby giving rise to a voltage-controlled magnetic anisotropy (VCMA) effect. The OOP anisotropy is increased or reduced depending on the characteristics of the applied voltage, and in this case the polarity of the applied voltage (i.e., direction of the electric field). The effect is opposite on the two sides of the DE barrier if both sides have the same FM material, for example if positive voltages increase the OOP anisotropy on one side they reduce it on the other side. The OOP anisotropy can additionally be tuned by controlling the FM composition (e.g., providing higher OOP anisotropy for higher Fe content in CoFeB), and the FM thickness (e.g., OOP anisotropy is larger for thinner films) as well as capping or seed layers (e.g. Ta provides larger OOP anisotropy compared to Ru when placed next to a CoFeB film adjacent to MgO).

In the following descriptions, it should be appreciated that IP and OOP anisotropies represent tendencies of the magnetization to go into the IP or OOP state. Since both anisotropies are present in devices according to the invention, the actual state of the magnetization may differ from the IP and OOP configurations. Accordingly, it is important not to confuse axes of anisotropy and directions of magnetization, which may or may not be the same.

Referring back to FIG. 1A, a pulse voltage depicted as a first voltage $V_{C1}$ is applied 18 to the figure at the left which forces magnetization into a meta-stable state seen in the center state. The meta-stable state then relaxes to a (similar or different) stable state after the removal 20 of the applied voltage $V_{C1}$. The final state 22, seen in the rightmost depiction depends on the direction of the overall magnetic field acting on the free layer, and can be controlled by applying a small external field. A similar scenario is shown in FIG. 1B, in which a second voltage $V_{C2}$ is used forcing magnetization into a meta-stable state in the center pane, which then relaxes as $V_{C2}$ is removed to the final state 22, which differs from that shown in FIG. 1A.

Application of the electric field (i.e., voltage), across the DE layer enhances perpendicular anisotropy on one side of the DE and reduces it on the other. The applied voltage generates no magnetization change on the fixed layer side, while rotating the magnetization of the free layer, allowing it to be switched by the stray field from the fixed layer. The difference between the terms "rotation" and "switching" should be appreciated. The term rotation, is meant herein to preferably refer to a 90 degree rotational change, although it can be somewhat less, but is usually more than a 45 degree rotational change from the stable state (i.e., from in-plane toward out-of-plane or from out-of-plane toward in-plane). The term "switching," on the other hand, refers to a full 180 degree reorientation of the magnetization. Hence, when rotation by the applied voltage is referred to, this only constitutes part of the full switching, which allows the stray field to then take it the remainder of the way to the full 180 degree switch (i.e., 180°=90° (V)+90° (stray field) or 85° (V)+95° (stray field), and so forth).

It should be appreciated that the role of the external field can be replaced by current-induced torques by allowing for a small leakage current to pass through the device, or by addition of a semi-fixed layer to the material stack, or by timing of the voltage pulse, as outlined below.

Accordingly, the final state depends on the direction of the overall magnetic field acting on the free layer, which in turn can be determined by the voltage pulse amplitude. It should be appreciated that an MEJ can be implemented which switches in response to positive voltage as seen, or using a slightly different design having an opposite sensitivity to electric fields, it will switch in response to negative voltage.

In addition, in certain embodiments the original pulse is timed to result in a precessional motion of the free layer magnetization, instead of an intermediate out-of-plane or micromagnetic domain state, as a result of which the final state is determined by the pulse width utilized, rather than by stray fields. In this case, pulses timed at approximately ½ of the precessional period, or an odd multiple thereof, will switch the bit to the opposite state (P to AP, or AP to P), while pulses timed at one or multiple full precessional periods will not switch it. It should be noted that the pulse widths can deviate up to about 20% from the ½ precessional period, or multiple thereof, and still be effective. In the absence of external magnetic fields, internal magnetic fields (such as due to leakage current), or very short voltage pulses (less than about 1-5 ns), each of these switches performs voltage-controlled switching only in one direction. Switching in the opposite direction can be performed by other means, such as a magnetic field or spin polarized current.

FIG. 2 depicts measured switching probability (based on 100 attempts with 100 ms long pulses) as a function of pulse voltage, for a 60 nm×190 nm high-resistance MEJ with an RA product of approximately 170 $\Omega\text{-}\mu m^2$. Switching in both directions is performed with the same voltage polarity.

The small, non-zero leakage current through the device, while not sufficient to bring about STT-induced switching by itself (due to the thick MgO), contributes to a spin transfer torque, which acts as a voltage-dependent effective magnetic field on the free layer. This allows for a unipolar set/reset write method to be utilized, where voltage pulses of the same polarity, yet with different amplitudes, pulse widths, or a combination of different amplitude and pulse widths, can be used to switch the device in opposite directions. Voltage pulses of the opposite polarity will not switch the device.

Magneto-electric tunnel junctions (MEJs) with a voltage-controlled switching mechanism as seen above are utilized to construct a nonvolatile content addressable memory (CAM) in which search noise margin issues are eliminated.

2. Non-Volatile CAM Using VCMA MEJs.

Figure 3:
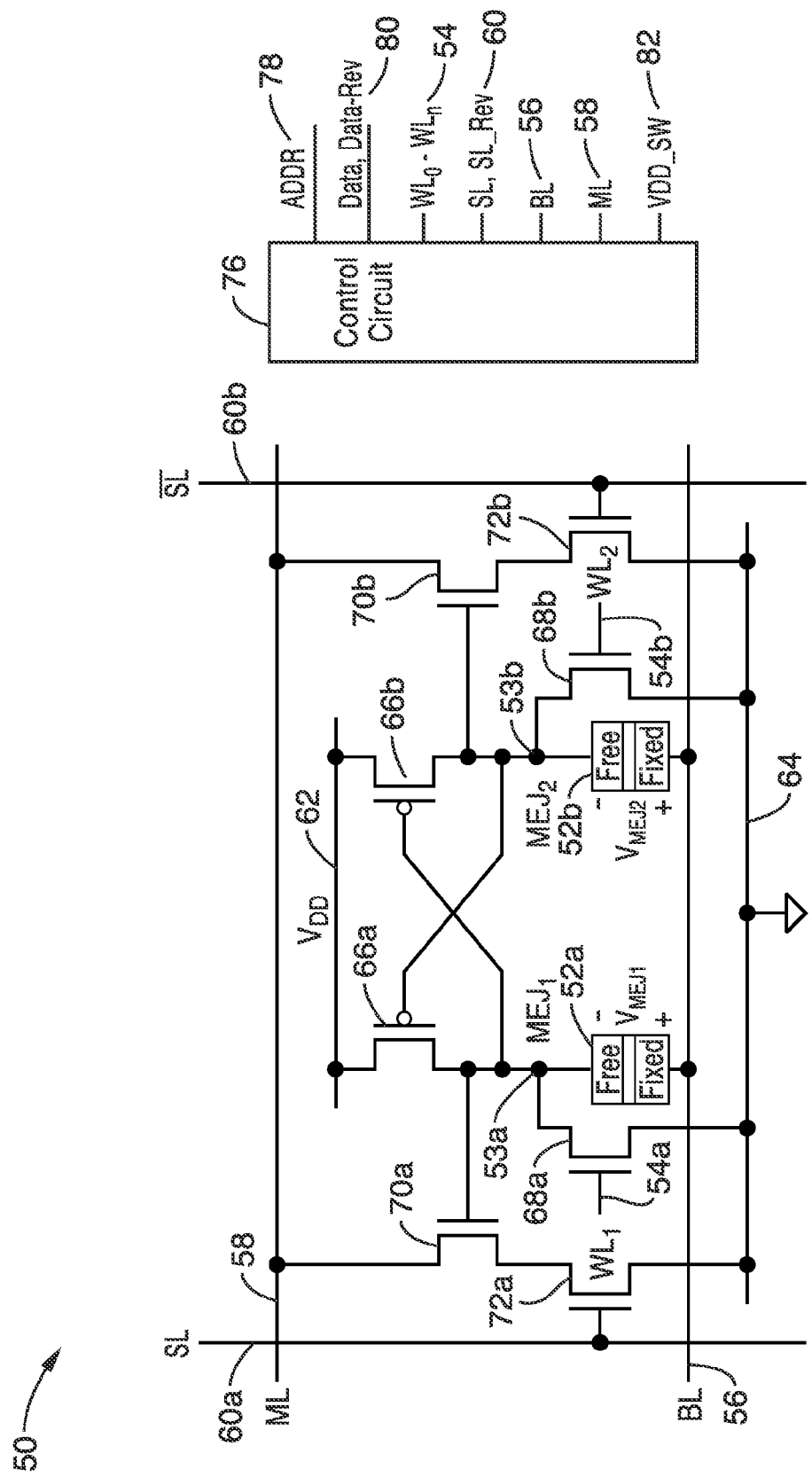
FIG. 3 is a schematic of a memory cell within a voltage controlled MEJ-based CAM according to an embodiment of the present invention.

FIG. 3 illustrates an example embodiment 50 of a CAM utilizing VCMA MEJs. Data is stored in a pair of voltage-controlled MEJs ($MEJ_1$ 52a and $MEJ_2$ 52b) in a complementary fashion as a cross-coupled pair which in combination store one bit of information. Various signals are shown in the figure, including a first word line 54a ($WL_1$) and second word line 54b ($WL_2$), bit-line 56 (BL), match-line 58 (ML), a first source-line 60a, (SL) and a second source line 60b (SL_Rev), along with a switched supply voltage ($V_{DD}$) 62 and ground 64. Source transistors (PMOS) 66a, 66b are shown with cross-coupled gating with source sides connected to a first side of MEJs 52a, 52b, at an $MEJ_1$ node 53a, and an $MEJ_2$ node 53b. The drains of transistors 66a, 66b are connected to $V_{DD}$, which according to the present invention can be switched on and off. The word line transistors (NMOS) 68a, 68b are gated by the word lines $WL_1$ 54a and $WL_2$ 54b and are also seen coupled to MEJ nodes 53a, 53b. Transistors (NMOS) 70a, 70b are seen gated at MEJ nodes 53a, 53b and coupled to the match-line 58 (ML) on their drain sides, with their source sides coupled through pull down transistors (NMOS) 72a, 72b connected to ground and gated by source lines SL 60a and SL_Rev 60b.

One of ordinary skill in the art will appreciate that the NMOS and PMOS transistors shown in the figure can be swapped (e.g., NMOS for PMOS, and PMOS for NMOS) to produce a circuit operating with the opposite polarity, without departing from the teachings of the present invention. The switched supply voltage would then be $V_{SS}$ instead of $V_{DD}$. One of ordinary skill in the art will appreciate that the circuit can be similarly implemented in other device technologies, even aside from using NMOS and PMOS transistors, without departing from the teachings of the present invention. Operation of the device is a follows.

A control circuit 76 is shown in FIG. 3 which generates the signals to the CAM device, which by way of example and not limitation, comprise address lines (Addr) 78, data lines (Data and Data_Rev) 80, as well as control signals including multiple word lines ($WL_0$-$WL_n$) 54, sense line (SL and SL_Rev) 60, a bit line (BL) 56, a match line (ML) 58, and a signal for switching $V_{DD}$ (VDD_SW) 82. It will be appreciated that the ability to use a control circuit to generate signals for content addressable memory including address, data and control signals with their various timings and signal amplitudes is recognized, whereby there is no need in the present invention to include further details on how these circuits generate the signals used in the novel CAM device.

During a write operation, $V_{DD}$ 62 is pulled low (e.g., turned off), with $MEJ_1$ 52a being written by applying the appropriate switching voltage to BL (see FIG. 2) and asserting $WL_1$ 54a. Similarly, $MEJ_2$ 52b is written by applying the complementary voltage to BL and asserting $WL_2$ 54b.

During a read operation, $WL_1$, $WL_2$, and BL are grounded. $V_{DD}$ is held high and supplies a signal through the pair of weak, cross-coupled PMOS transistors 66a, 66b causing nodes $MEJ_1$ 53a and $MEJ_2$ 53b to differentiate. In response to differentiation, the higher resistance node latches high, while the lower resistance node latches to ground. During the pre-charge phase of the read operation, ML 58 is precharged high and left floating during the evaluation phase. During the evaluation phase, search bits data and (data_rev) (not shown) are applied to SL 60a and SL_Rev 60b respectively. In the event of a mismatch (data searched≠data stored), ML 58 discharges to ground. Since writing of the MEJ was performed with a first polarity (positive) while a second polarity (negative) of voltage was applied to both MEJs during the entire read operation, then the probability of accidental writing is 0.

3. Optimization and Simulation Results.

A 144-bit by 128-word CAM was designed and simulated, for IPv6 Ethernet routing for future fabrication in a 65 nm technology, using VCMA MEJs with an $R_P$ of 100 kΩ, a TMR of 100%, and set/reset voltages of 0.9V and 0.6V, respectively, for approximately 5 ns device switching.

Figure 4:
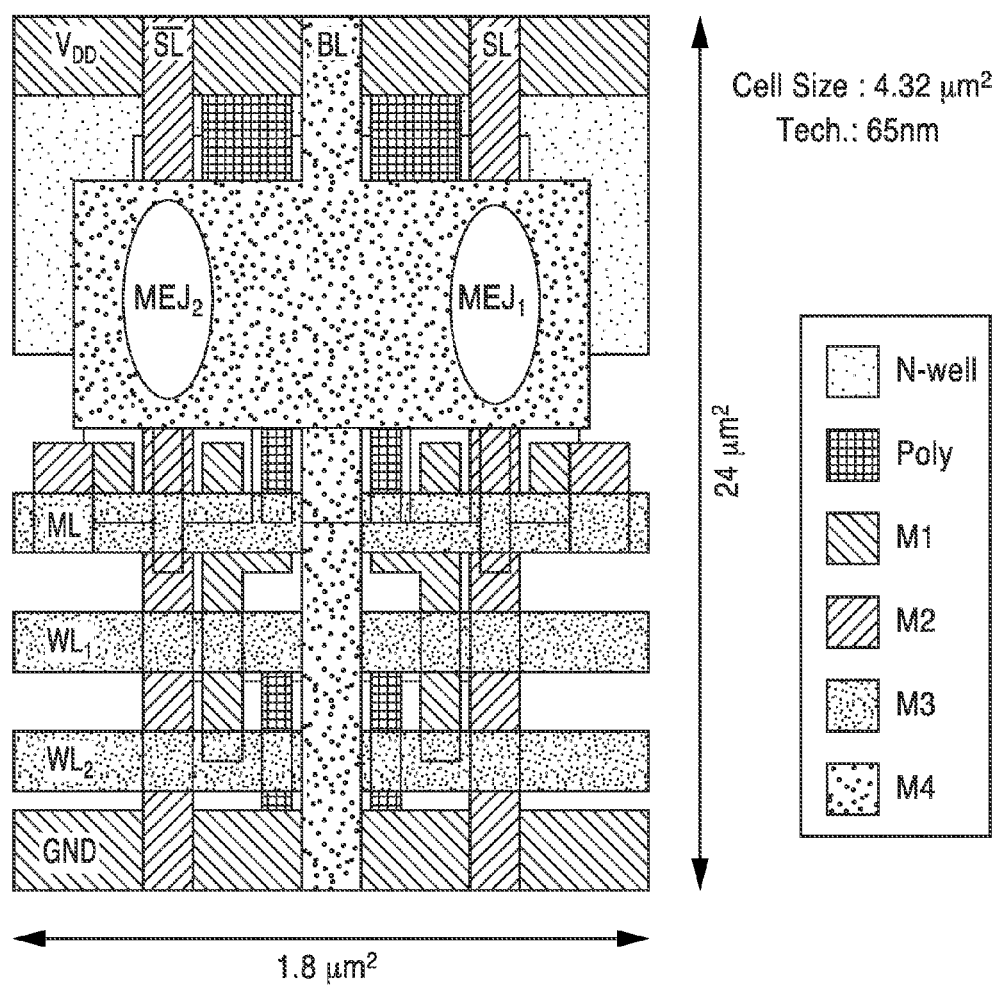
FIG. 4 is a layout diagram of a voltage controlled MEJ-based CAM cell according to an embodiment of the present invention.

FIG. 4 illustrates a layout in a 65 nm technology for an embodiment of the nonvolatile CAM bit cell shown in FIG. 3 having a length of 2.4 µm and width of 1.8 µm, thus an area of 4.32 µm². In the layout, one sees the two MEJs, $V_{DD}$, GND, $WL_1$, $WL_2$, ML, BL, SL, SL_Rev, and six materials including poly, N-well and metal layers M1, M2, M3 and M4. (It will be noted that "M1" notation is a standard notation for metals used by foundries.)

Figure 5:
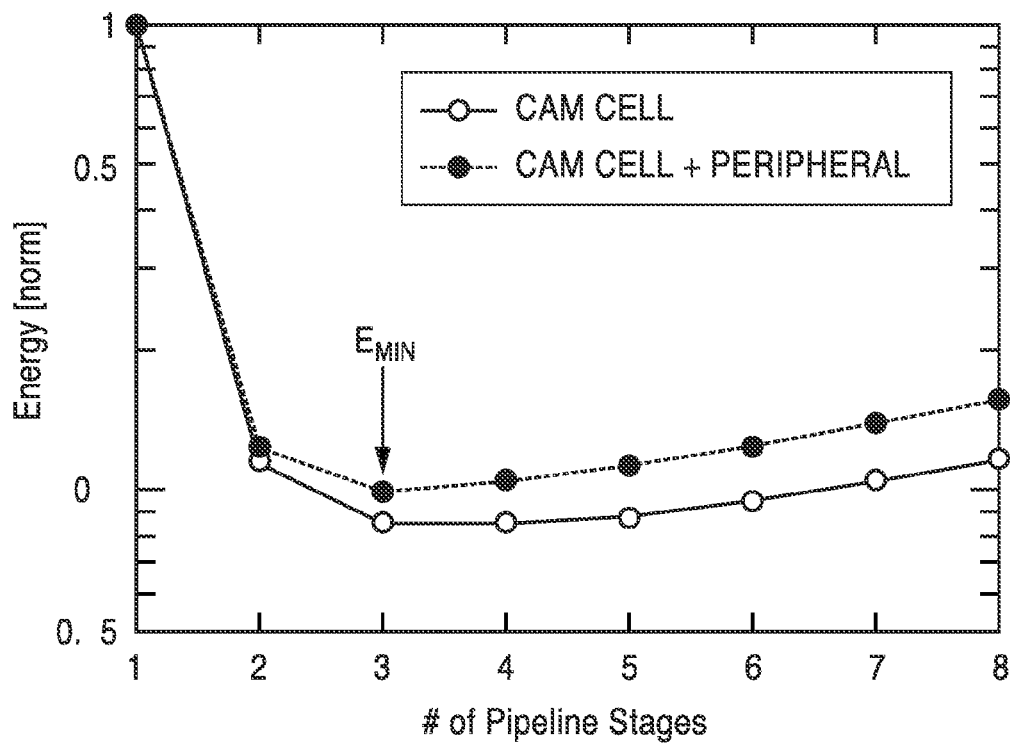
FIG. 5 is a graph of energy requirements based on the number of pipeline stages according to an embodiment of the present invention.

FIG. 5 depicts required search energy in response to the number of pipeline stages. In order to minimize search energy, the match-line of the inventive CAM was separated into 3 pipelined stages, as this provided the lowest search energy for the CAM. It will be appreciated that a mismatch in one segment of the search stops the search and shuts the power off to the following stages.

Figure 6:
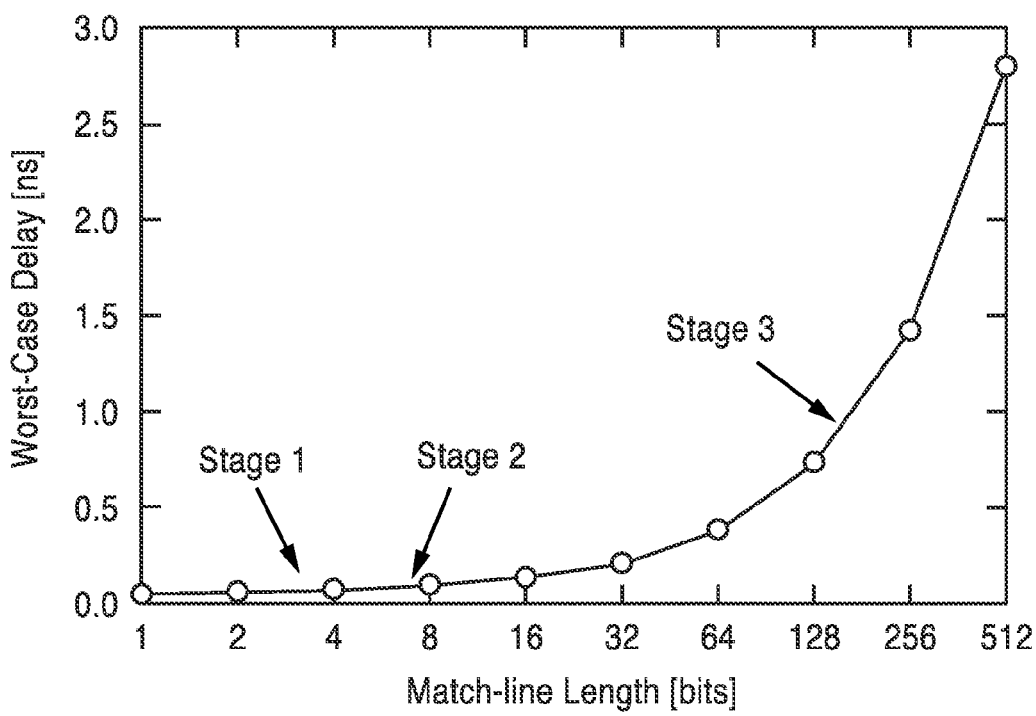
FIG. 6 is a graph of worst case delay with respect to match line length according to an embodiment of the present invention.

FIG. 6 depicts worst case delay with respect to match line length for the described embodiment. Optimizing the length of each segment for minimal energy usage, however, creates unequal pipeline delay. To overcome this issue and maximize performance, global and local match-lines were implemented in the final pipeline stage.

Figure 7:
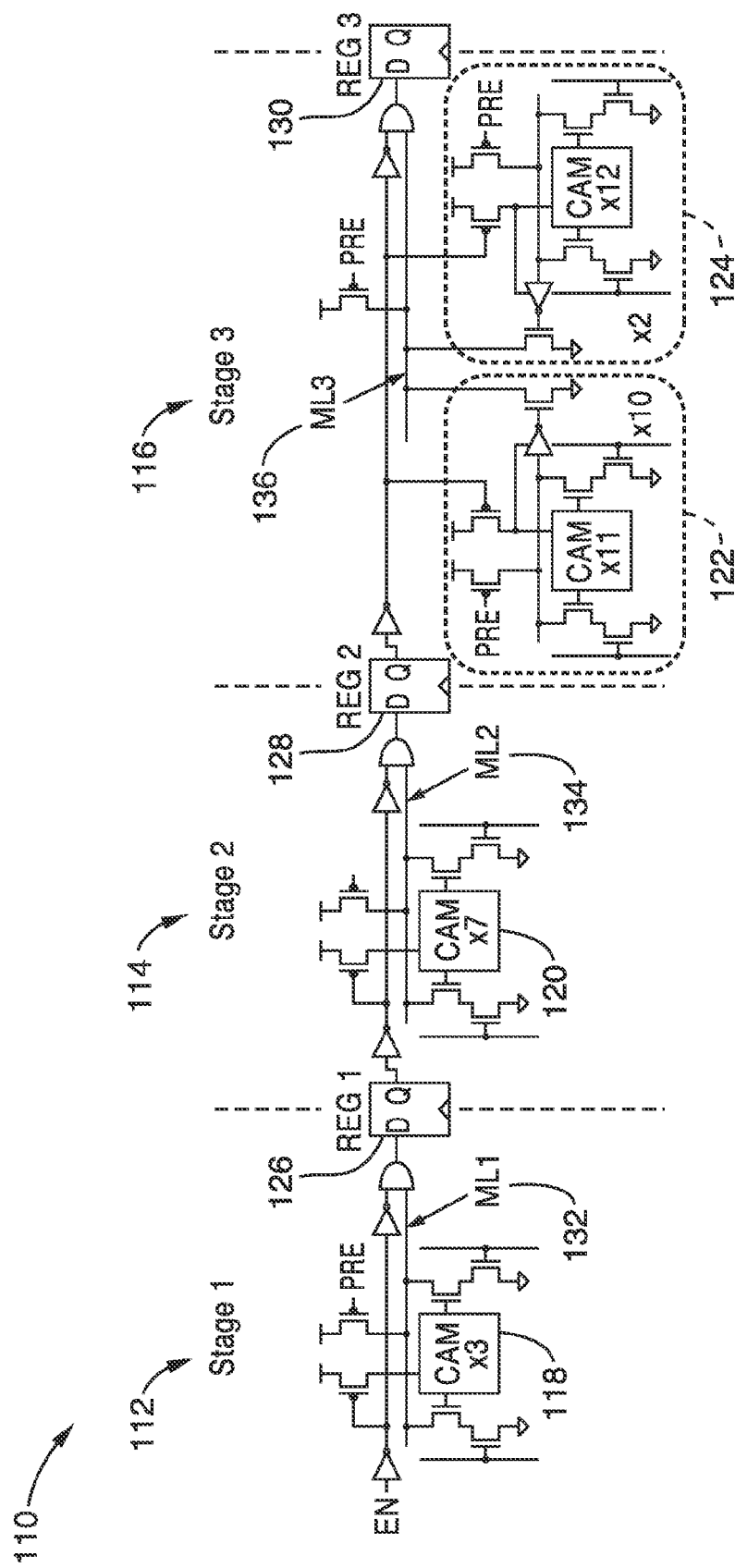
FIG. 7 is a schematic of a match line according to an embodiment of the present invention, showing three-stage match line segmentation and pipelining.

FIG. 7 illustrates an embodiment 110 of overall match-line architecture, with 3-stage match-line segmentation and pipelining. Three stages 112, 114, 116 are seen in the figure, each having a given size CAM, depicted as a first stage with ×3 CAM 118, a second stage with ×7 CAM 120, and a third stage having local and global match lines with an ×11 122 and ×12 CAM 124. The global match line is ML 136, with an ML inside each of the CAM blocks 122, 124 having local match lines. The local and global match-lines are used in the third stage to reduce worst-case delay (1-bit mismatch) from approximately 1 ns to less than 200 ps. The stages are interconnected with registers 126, 128 and a register 130 at the output. It will be appreciated that the registers allow the results to be pipelined so that the CAM operates faster. The 3 stages of match line is seen in the figure as $ML_1$ 132, $ML_2$ 134 and $ML_3$ 136.

Figure 8:
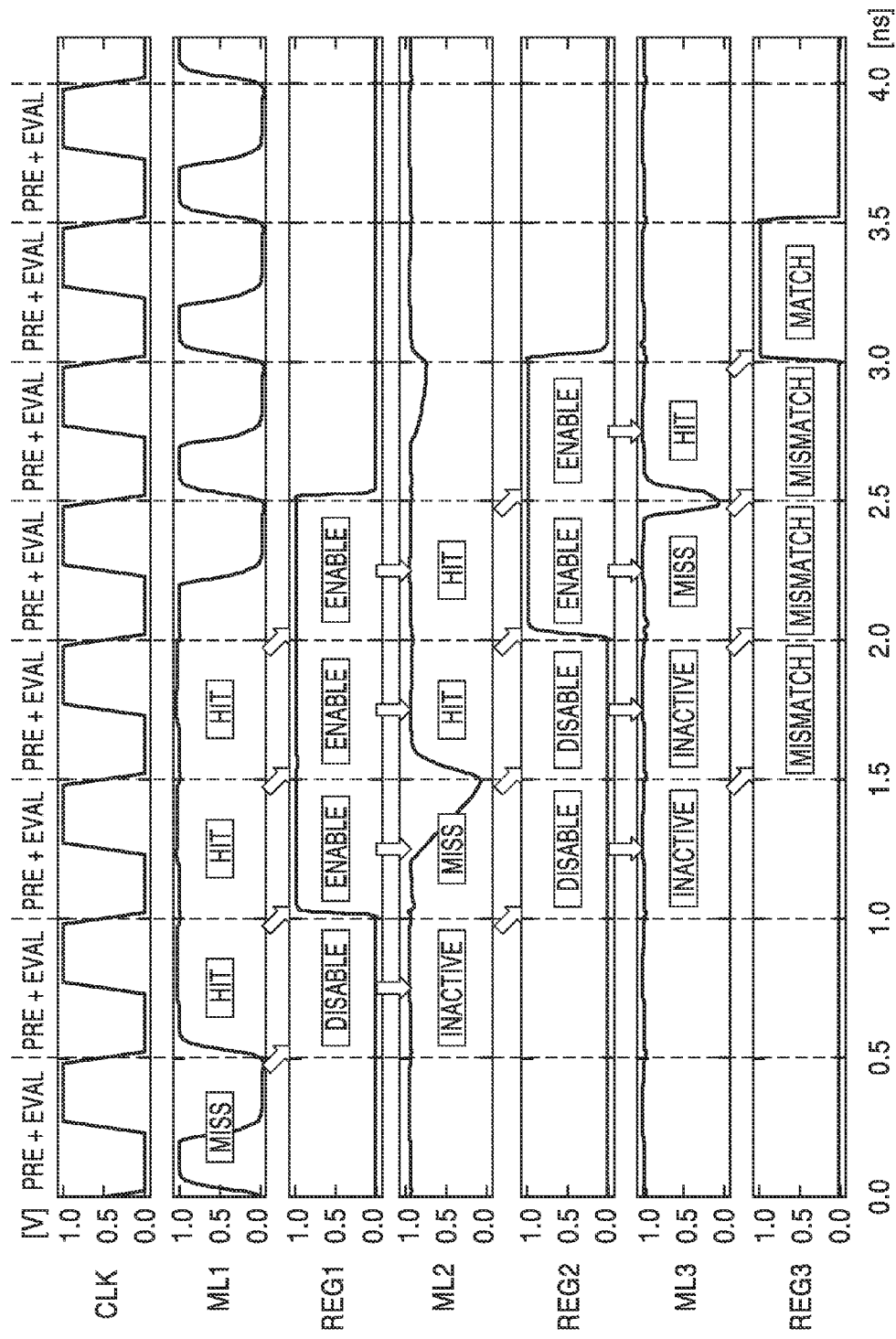
FIG. 8 is a timing diagram of CAM search operation according to an embodiment of the present invention, demonstrating 1 bit mismatches in a first, second and third stage.

FIG. 8 illustrates a timing diagram as an HSPICE simulation of the nonvolatile, voltage-controlled, MEJ-based CAM, which demonstrates the functionality of the 3-stage match-line segmentation and pipelining scheme. The timing diagram shows a clock (CLK), match lines $ML_1$, $ML_2$, $ML_3$, as well as the activity of the registers $REG_1$, $REG_2$ and $REG_3$. It was found in the simulation that even under the worst-case mismatch, a 1-bit mismatch in the third stage, the CAM is able to operate up to 2 GHz while only using 0.275 fJ/bit/search.

In FIG. 8 the four possible scenarios for a cache hit or miss are shown, which are described herein in relation to the structure or signal seen in FIG. 7: (1) a cache miss originating on ML1 132 in stage 1 112; (2) a cache miss originating on ML2 134 in stage 2 114); (3) a cache miss originating on ML3 136 in stage 3 116, and (4) a cache hit on ML3 136 in stage 3 116.

The actions of these scenarios are described based on the relative timing of FIG. 8 (seen on the x-axis of that figure). For scenario (1) A miss on ML1 (between times 0.0 ns and 0.5 ns) results in REG1 being disabled (between times 0.5 ns and 1.0 ns). While REG1 is disabled, ML2 is inactive (between times 0.5 ns and 1.0 ns), causing REG2 to be disabled in the next cycle (between times 1.0 ns and 1.5 ns). While REG2 is disabled, ML3 is inactive (between times 1.0 ns and 1.5 ns), causing REG3 to record a MISMATCH on the next cycle (between times 1.5 ns and 2.0 ns).

For scenario (2), a hit on ML1 (between times 0.5 ns and 1.0 ns) results in REG1 being enabled (between times 1.0 ns and 1.5 ns). While REG1 is enabled, ML2 is active but experiences a miss (between times 1.0 ns and 1.5 ns), causing REG2 to be disabled in the next cycle (between times 1.5 ns and 2.0 ns). While REG2 is disabled, ML3 is inactive (between times 1.5 ns and 2.0 ns), causing REG3 to record a MISMATCH on the next cycle (between times 2.0 ns and 2.5 ns).

For scenario (3), a hit on ML1 (between times 1.0 ns and 1.5 ns) results in REG1 being enabled (between times 1.5 ns and 2.0 ns). While REG1 is enabled, ML2 is active and experiences a hit (between times 1.5 ns and 2.0 ns), causing REG2 to be enabled in the next cycle (between times 2.0 ns and 2.5 ns). While REG2 is enabled, ML2 is active but experiences a miss (between times 2.0 ns and 2.5 ns), causing REG3 to record a MISMATCH on the next cycle (between times 2.5 ns and 3.0 ns).

Table 1 compares several STT-MTJ and CMOS-only CAM designs with the inventive voltage controlled MEJ based CAM. It can be seen in the table that the voltage-controlled MEJ based CAM shows a 7.1 to 25.8 times energy improvement over the use of STT-MTJ CAMs, and is significantly faster than CMOS-only CAM arrays with similar energy efficiencies. The following sections provide additional details about general MeRAM structure and operation.

4. General MEJ Structure and Operation.

Figure 9:
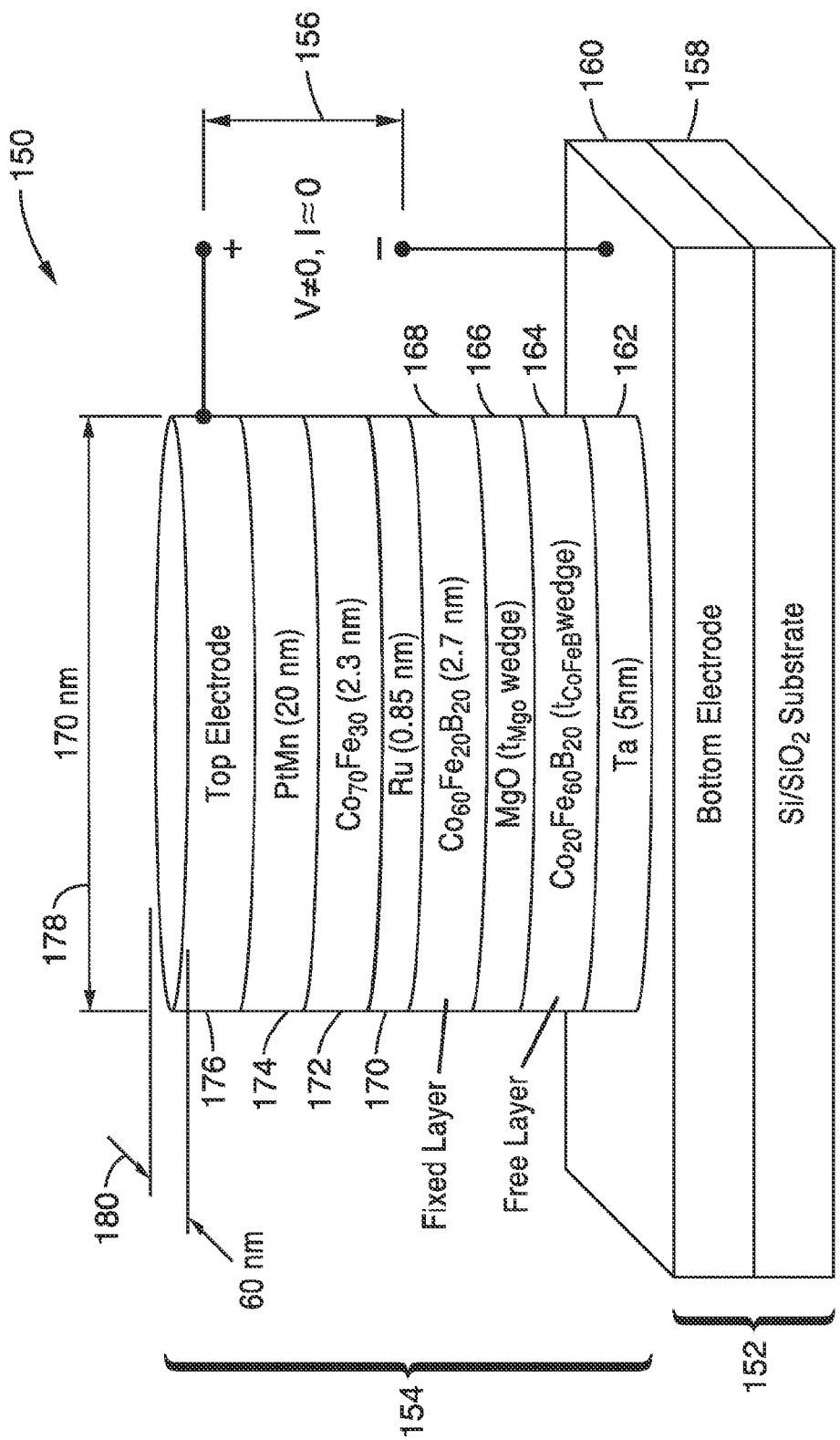
FIG. 9 is a side view of an MEJ having a plurality of layers according to an element of the present invention.

FIG. 9 illustrates an example embodiment 150 of a magneto-electric tunnel junction (MEJ) configured for voltage switching. This figure is a preferred MEJ embodiment for use in the present invention, showing many additional layers which enhance utility.

A pillar section 154 extends from a planar section 152. A voltage is shown being applied 156 between the top and bottom of pillar 154. By way of example an $Si/SiO_2$ substrate 158 is seen over which is a bottom electrode 160 of a conductive material. The pillar 154 comprises the following layers in order. A tantalum (Ta) layer 162 (e.g., 5 nm) above which is seen a free layer 164 of a ferromagnetic material (e.g., iron), such as one also containing Cobalt and Boron, herein exemplified with $Co_{20}Fe_{60}B_{20}$. Above the fixed layer is seen a dielectric layer (DE) layer 166, such as comprising Magnesium-oxide (MgO). The DE layer separates the free layer 164, from a FM fixed layer 168 of another ferromagnetic material (e.g., iron), such as one also containing Cobalt and Boron, herein exemplified with $Co_{60}Fe_{20}B_{20}$.

An antiferromagnetic inter-layer exchange coupling layer is optionally provided in a preferred embodiment, such as that comprising Ruthenium (Ru) 170 (e.g., 0.85 nm) to provide antiferromagnetic inter-layer exchange coupling.

Then an exchange-biased layer of a CoFe material, such as $Co_{70}Fe_{30}$, (e.g., 2.3 nm) 172 is optionally incorporated in a preferred embodiment, having magnetization orientation pinned by exchange bias within an exchange bias pinning layer, such as that comprising a layer of antiferromagnetic material, such as a platinum-manganese (PtMn) combination (e.g., 20 nm) 174.

A top conductive electrode 176 is then seen on top of the stack and works in combination with bottom electrode 160 for applying voltages across said MEJ for reading and writing. By way of example and not limitation, the pillar of the devices utilized in this implementation of this embodiment is 170 nm (178)×60 nm (180) elliptical nanopillars.

4.1 VCMA-Induced Switching.

Switching is performed in the MEJ by exploiting the voltage-controlled magnetic anisotropy (VCMA) at the interface between the Fe-rich CoFeB free layer and MgO. In these MEJ devices, the free layer thickness may be chosen such that the interfacial (voltage-controlled) perpendicular anisotropy is close to compensate the easy-plane shape anisotropy, a condition that enhances the tunability of the coercivity by voltage.

Figure 10:
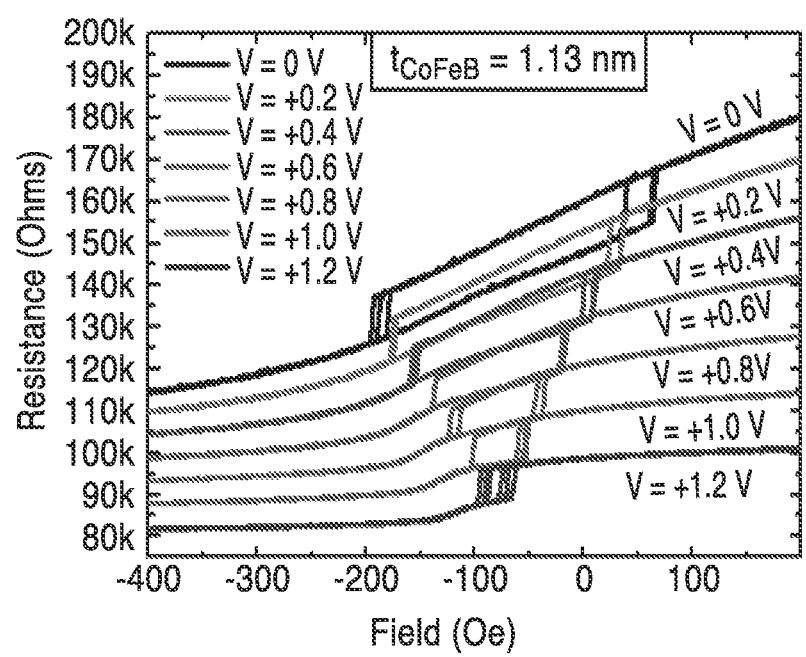
FIG. 10 is a graph of resistance with respect to the intensity of the magnetic field according to an element of the present invention.

FIG. 10 depicts coercivity and resistance changes in response to applied voltage. In the set of curves in the figure coercivity is shown being reduced in response to the VCMA effect from about 120 Oe at equilibrium to approximately 10-20 Oe by applying about 1 V.

Figure 11A:
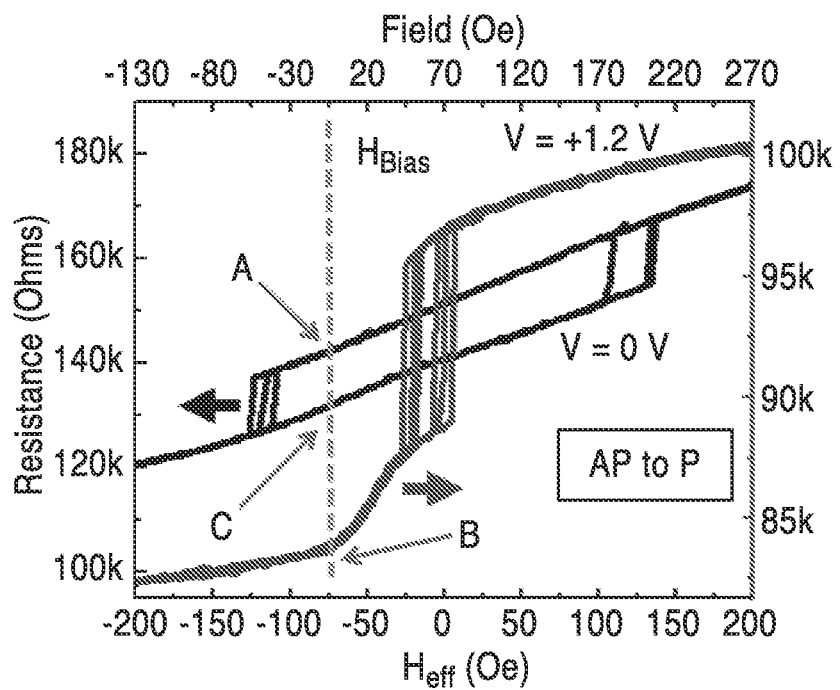
FIG. 11A and FIG. 11B are graphs of MEJ resistance in response to effective magnetic field according to an element of the present invention.
Figure 11B:
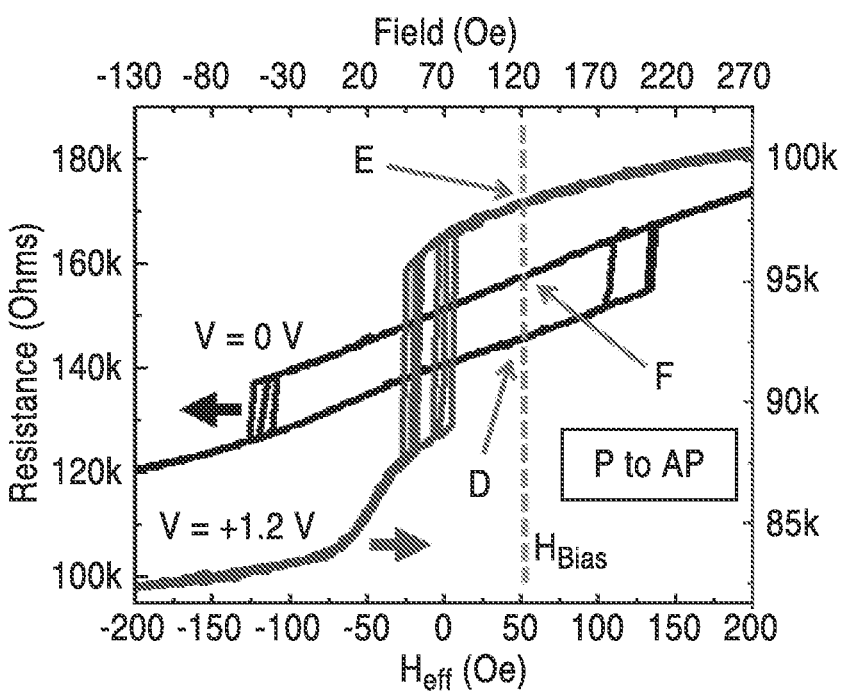

FIG. 11A and FIG. 11B illustrate magnetic hysteresis curves at equilibrium (0 V) and at a positive voltage for VCMA switching from AP to P seen in FIG. 11A and from P to AP as seen in FIG. 11B. The equilibrium state has a coercivity of about 120 Oe, and the TMR ratio between its high- and low-resistance domain wall states is approximately 9%. The loops show an offset field $H_{off}$ of about 70 Oe due to non-zero coupling to the pinned layer. The top horizontal axis denotes the easy axis bias field $H_{bias}$ applied to the device, while the bottom horizontal axis shows the effective field $H_{eff}=H_{bias}-H_{off}$. When a positive voltage pulse is applied to a device in the high-resistance state as seen at point A in FIG. 11A and FIG. 12, the perpendicular anisotropy of the free layer is modified, reducing its coercivity. As a result, under the new energy landscape, the magnetization is forced to relax to the low-resistance intermediate state, as seen at point B in FIG. 11A and FIG. 12. After the voltage is removed, the magnetization reconfigures into the opposite state as seen at point C in FIG. 11A and FIG. 12, completing the reversal process. FIG. 11B shows that the sign of the effective field acting on the free layer, (i.e., $H_{eff}$) will determine the direction of switching, and hence the voltage-induced switching is unidirectional for a given bias magnetic field. The effect of this bias field may be replaced by a non-zero leakage current through the device, as described below.

4.2 Switching Dynamics.

Figure 12:
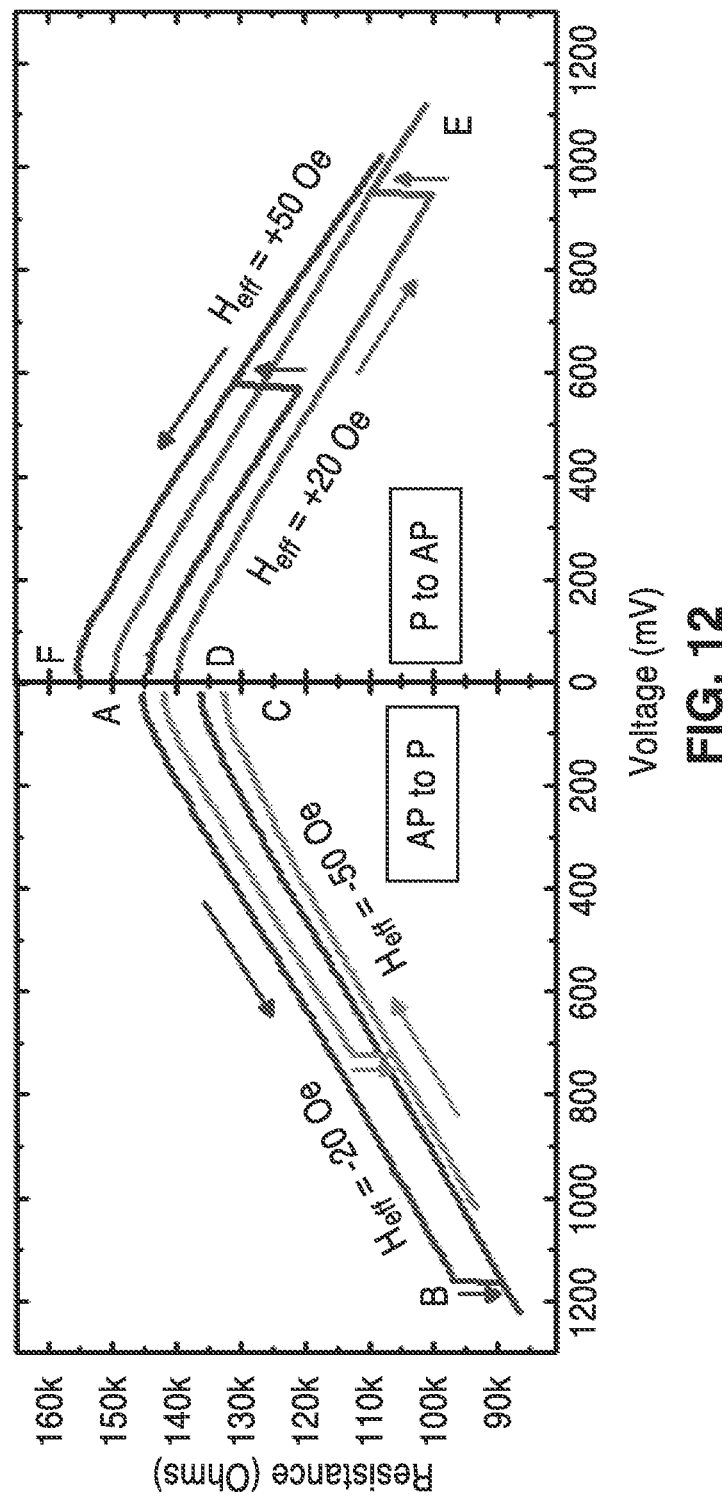
FIG. 12 is a graph of quasi-static resistance with respect to voltage for different effective magnetic fields for a voltage controlled MEJ according to an element of the present invention.

FIG. 12 depicts quasi-static loops indicating switching hysteresis and voltage dependence of the MEJ resistance. Switching in both directions was performed using voltages of the same polarity, with a small bias magnetic field to determine the direction. The large resistance of the embodied MEJ assures that the leakage currents were always <10 μA, and therefore the observed phenomena corresponds to purely voltage effects.

Figure 13:
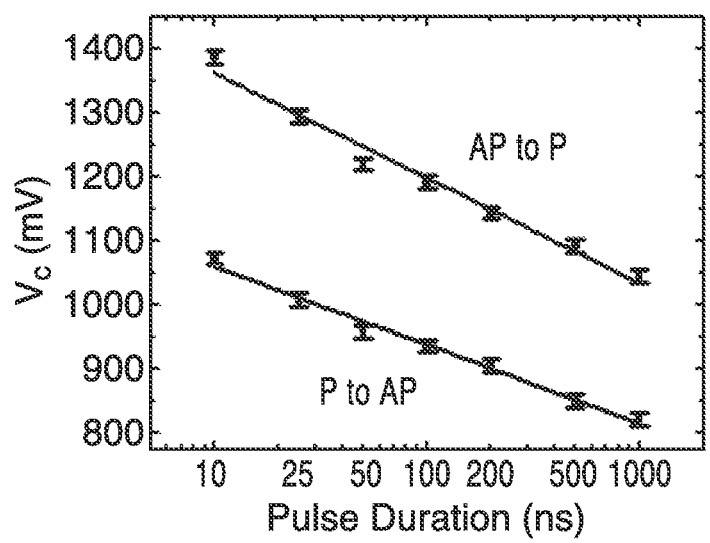
FIG. 13 is a graph of switching voltage and pulse duration for P to AP and AP to P switching for a voltage controlled MEJ according to an element of the present invention.

FIG. 13 depicts the dependence of the mean switching voltage $V_c$ as a function of the applied voltage pulse width t, measured down to 10 ns, fitting well into a thermal activation model given as follows:

$$V_C = V_{C0}(1 - \Delta^{-1} \ln(t/\tau_0))$$

The results demonstrate voltage-induced switching of the free layer with amplitudes of approximately 1 V for both low (parallel, or P) to high (anti-parallel, or AP), and AP to P switching directions, translating into switching energies ~60 fJ (at 10 ns). This level of switching energy is one order of magnitude smaller than that compared to STT MRAM switching. It should also be appreciated that the leakage current can be further reduced below <$10^5$ A/cm2 by fabricating the MEJ with a thicker layer of MgO.

Figure 14:
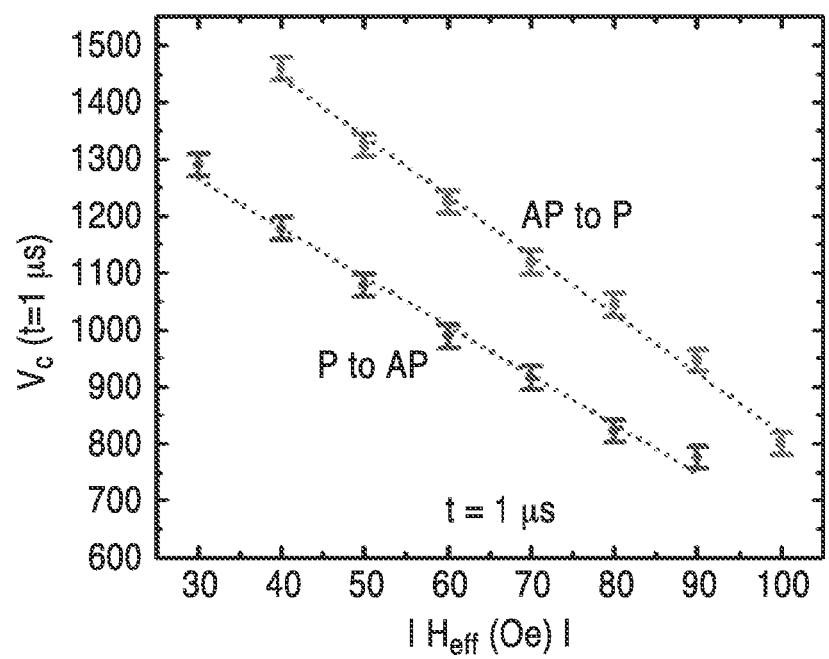
FIG. 14 is a graph of switching voltage and magnetic field intensity for P to AP and AP to P switching for a voltage controlled MEJ according to an element of the present invention.

FIG. 14 depicts the switching voltage decrease with increasing $H_{eff}$, indicating a trade-off between the switching voltage amplitude and the magnetic field which assists the switching process.

Figure 15:
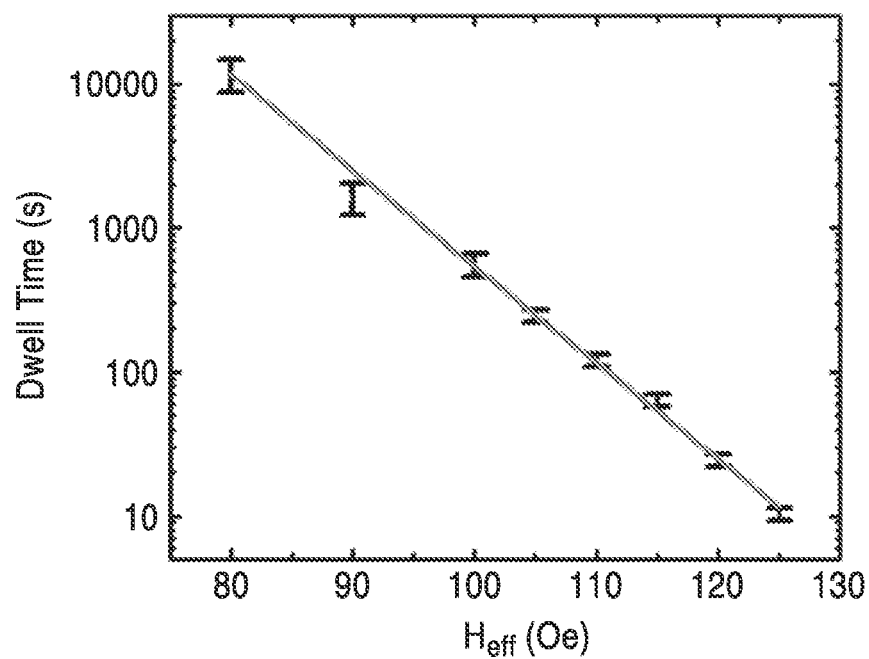
FIG. 15 is a graph of dwell time in response to magnetic field intensity for thermally activated switching according to an element of the present invention.

FIG. 15 depicts thermal stability of the MEJ in its equilibrium state by measuring the time required for thermally activated switching which increases as $H_{eff}$ is reduced. For this measurement the mean time was measured for thermally-induced switching for different magnetic fields applied to the device. Extrapolation of the curve to the standby ($H_{eff}$=0 Oe) condition yields a retention time of ~$1.7 \times 10^9$ seconds, which is beyond 50 years, and is sufficient stability for a nonvolatile memory operation.

4.3. Combined VCMA+STT Switching.

To overcome the need for different external magnetic fields to induce switching in opposite directions, a small non-zero leakage current may be utilized. It will be appreciated that the small leakage current is still not sufficient to bring about STT-induced switching, but rather contributes to a field-like STT, acting as a voltage-dependent $H_{eff}$ on the free layer.

Varying pulse amplitude allows controlling switching direction without the need for varying external magnetic fields. From the measured switching probability seen in FIG. 2 it should be appreciated that VCMA and STT can be combined into a unipolar set/reset write scheme, where voltage pulses of the same polarity, but different amplitudes, are utilized to switch the device in opposite directions without changing $H_{eff}$ in the free layer. Voltage pulses of the opposite polarity will not switch the device, thus they could be used to create disturbance-free read schemes for the nonvolatile memory elements.

From the discussion above it will be appreciated that the invention can be embodied in various ways, including the following:

1. A voltage-controlled magnetic anisotropy (VCMA) magnetoelectric content addressable memory (CAM) apparatus, comprising: an array of magnetoelectric content addressable memory (CAM) cells, wherein each cell receives two word lines, a bit line, a match-line, complementary source lines, a switched supply voltage and a ground; at least two complementary magnetoelectric tunnel junctions (MEJs), comprising a first MEJ and a second MEJ in each of said CAM cells, each MEJ having at least two ferromagnetic (FM) layers separated by a dielectric (DE) layer, and in which said at least two FM layers comprise at least an FM fixed layer and an FM free layer; and a transistor circuit which during a write pulls the switched supply voltage low, with the first MEJ written in response to a switching voltage applied to the bit line and asserting a first word line, while the second MEJ is written by applying a complementary switching voltage to the bit line and asserting a second word line; said transistor circuit during a read operation grounds the two word lines and the bit line while holing VDD high as a signal is supplied through a pair of weak cross-coupled transistors, one each of which is disposed between the switched supply voltage and each of the first and second MEJs, causing a node at one end of each of said first and second MEJ to differentiate, resulting in the node with higher resistance latching high, while the node with lower resistance latching to ground; said transistor circuit having a precharge phase of a read operation in which the match line is precharged high and left floating during a subsequent evaluation phase; wherein search bits having a data bit and its complement are applied to the complementary source lines during an evaluation phase of content addressability in which the match line is pulled low in response to a mismatch, in which data searched for does not equal data stored in said CAM); and wherein it is not possible for the read operations performed during searching of said CAM apparatus to switch the MEJs, because writing of the MEJs in said CAM apparatus were performed with an opposite polarity as reading of the MEJs during search.

2. The apparatus of any of the previous embodiments, wherein during the read operation magnetization orientation of each said MEJ is read by measuring electrical resistance through at least said two FM layers and said DE layer in response to tunneling magnetoresistance (TMR) properties.

3. The apparatus of any of the previous embodiments, wherein said ferromagnetic layers comprise a CoFeB material.

4. The apparatus of any of the previous embodiments, wherein said fixed layer comprises a Co60Fe20B20 material.

5. The apparatus of any of the previous embodiments, wherein said free layer comprises a Co20Fe60B20 material.

6. The apparatus of any of the previous embodiments, further comprising at least one layer adjacent said fixed ferromagnetic layer to provide antiferromagnetic inter-layer exchange coupling.

7. The apparatus of any of the previous embodiments, further comprising at least one layer providing antiferromagnetic inter-layer exchange coupling.

8. The apparatus of any of the previous embodiments, wherein said layer providing antiferromagnetic inter-layer exchange coupling comprises a Ruthenium (Ru) layer.

9. The apparatus of any of the previous embodiments, further comprising at least one exchange biased layer whose magnetization is pinned by an exchange bias pinning layer.

10. The apparatus of any of the previous embodiments, wherein said exchange biased layer comprises a CoFe material, and said exchange bias pinning layer comprises platinum-manganese (PtMn).

11. The apparatus of any of the previous embodiments, wherein said dielectric material comprises MgO.

12. The apparatus of any of the previous embodiments, wherein said CAM apparatus is fabricated with a complementary metal oxide semiconductor (CMOS) process below 90 nanometers.

13. The apparatus of any of the previous embodiments, wherein each of said MEJs has a leakage current less than 10 microamps ( ).

14. The apparatus of any of the previous embodiments, further comprising multiple pipeline stages, each stage comprising multiple CAM cells of said CAM apparatus.

15. The apparatus recited in claim 1, wherein a mismatch of searched for data and data contained in said CAMs in each said pipeline stage stops the search and shuts off power to succeeding stages.

16. The apparatus of any of the previous embodiments, further comprising local and global match lines incorporated within a final stage of said multiple pipeline stages, toward overcoming unequal pipeline delays.

17. The apparatus of any of the previous embodiments, wherein a match line is associated with each said stage of said multiple pipeline stages.

18. A voltage-controlled magnetic anisotropy (VCMA) magnetoelectric content addressable memory (CAM) apparatus, comprising: an array of magnetoelectric content addressable memory (CAM) cells, wherein each cell receives two word lines, a bit line, a match-line, complementary source lines, a switched supply voltage and ground; at least two complementary magnetoelectric tunnel junctions (MEJs), comprising a first MEJ and a second MEJ in each of said CAM cells, each MEJ having at least two ferromagnetic (FM) layers separated by a dielectric (DE) layer, and in which said at least two FM layers comprise at least an FM fixed layer and an FM free layer; at least one layer adjacent said fixed ferromagnetic layer to provide antiferromagnetic inter-layer exchange coupling; at least one layer providing antiferromagnetic inter-layer exchange coupling; at least one exchange biased layer whose magnetization is pinned by an exchange bias pinning layer; and a transistor circuit which during a write pulls the switched supply voltage low, with the first MEJ written in response to a switching voltage applied to the bit line and asserting a first word line, while the second MEJ is written by applying a complementary switching voltage to the bit line and asserting a second word line; said transistor circuit during a read operation grounds the two word lines and the bit line while holing VDD high as a signal is supplied through a pair of weak cross-coupled transistors, one each of which is disposed between the switched supply voltage and each of the first and second MEJs, causing a node at one end of each of said first and second MEJ to differentiate, resulting in the node with higher resistance latching high, while the node with lower resistance latching to ground; said transistor circuit having a precharge phase of a read operation in which the match line is precharged high and left floating during a subsequent evaluation phase; wherein search bits having a data bit and its complement are applied to the complementary source lines during an evaluation phase of content addressability in which the match line is pulled low in response to a mismatch, in which data searched for does not equal data stored in said CAM); and wherein it is not possible for the read operations performed during searching of said CAM apparatus to switch the MEJs, because writing of the MEJs in said CAM apparatus were performed with an opposite polarity as reading of the MEJs during search.

19. The apparatus of any of the previous embodiments, further comprising: multiple pipeline stages, each stage comprising multiple CAM cells of said CAM apparatus, with a match line is associated with each said stage of said multiple pipeline stages; wherein a mismatch of searched for data and data contained in said CAMs in each said pipeline stage stops the search and shuts off power to succeeding stages; and wherein a final stage of said pipeline comprises local and global match lines toward overcoming unequal pipeline delays.

20. A voltage-controlled magnetic anisotropy (VCMA) magnetoelectric content addressable memory (CAM) apparatus, comprising: an array of magnetoelectric content addressable memory (CAM) cells, wherein each cell receives two word lines, a bit line, a match-line, complementary source lines, a switched supply voltage and ground; at least two complementary magnetoelectric tunnel junctions (MEJs), comprising a first MEJ and a second MEJ in each of said CAM cells, each MEJ having at least two ferromagnetic (FM) layers separated by a dielectric (DE) layer, and in which said at least two FM layers comprise at least an FM fixed layer and an FM free layer; and a transistor circuit which during a write pulls the switched supply voltage low, with the first MEJ written in response to a switching voltage applied to the bit line and asserting a first word line, while the second MEJ is written by applying a complementary switching voltage to the bit line and asserting a second word line; said transistor circuit during a read operation grounds the two word lines and the bit line while holing VDD high as a signal is supplied through a pair of weak cross-coupled transistors, one each of which is disposed between the switched supply voltage and each of the first and second MEJs, causing a node at one end of each of said first and second MEJ to differentiate, resulting in the node with higher resistance latching high, while the node with lower resistance latching to ground; said transistor circuit having a precharge phase of a read operation in which the match line is precharged high and left floating during a subsequent evaluation phase; wherein search bits having a data bit and its complement are applied to the complementary source lines during an evaluation phase of content addressability in which the match line is pulled low in response to a mismatch, in which data searched for does not equal data stored in said CAM); wherein it is not possible for the read operations performed during searching of said CAM apparatus to switch the MEJs, because writing of the MEJs in said CAM apparatus were performed with an opposite polarity as reading of the MEJs during search; multiple pipeline stages, each stage comprising multiple CAM cells within said CAM apparatus, with a match line associated with each said stage of said multiple pipeline stages so that a mismatch of searched for data and data contained in said CAMs in each said pipeline stage stops the search and shuts off power to succeeding stages; and wherein a final stage of said pipeline comprises local and global match lines toward overcoming unequal pipeline delays.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

Feature Summary and Comparison of CAMs

| Reference | DRAM-style MTJ | 2T-2MTJ | 6T-2MTJ | CMOS-only | This MEJ CAM |
|---|---|---|---|---|---|
| Configuration | 144-bit ML | 144 × 256 | 144 × 256 | 144 × 256 | 144 × 128 |
| Technology | 0.18 µm | 90 nm | 90 nm | 65 nm | 65 nm |
| Cell Area [µm] | 36.0 (1111 $F^2$) | 2.5 (309 $F^2$) | 10.35 (1278 $F^2$) | 7.05 (1669 $F^2$) | 4.32 (1022 $F^2$) |
| Supply Voltage [V] | 1.8 | 1.2 | 1.2 | 1.0 | 1.0 |
| Op. Frequency [MHz] | 200 | 770 | 575 | 400 | 2000 |
| Energy [fJ/bit/search] | 7.10 | 4.29 | 1.94 | 0.165-0.345 | 0.275 |

What is claimed is:

1. A voltage-controlled magnetic anisotropy (VCMA) magnetoelectric content addressable memory (CAM) apparatus, comprising:
   an array of magnetoelectric content addressable memory (CAM) cells, wherein each cell receives two word lines, a bit line, a match-line, complementary source lines, a switched supply voltage and a ground;
   at least two complementary magnetoelectric tunnel junctions (MEJs), comprising a first MEJ and a second MEJ in each of said CAM cells, each MEJ having at least two ferromagnetic (FM) layers separated by a dielectric (DE) layer, and in which said at least two FM layers comprise at least an FM fixed layer and an FM free layer; and
   a transistor circuit which during a write pulls the switched supply voltage low, with the first MEJ written in response to a switching voltage applied to the bit line and asserting a first word line, while the second MEJ is written by applying a complementary switching voltage to the bit line and asserting a second word line;
   said transistor circuit during a read operation grounds the two word lines and the bit line while holing $V_{DD}$ high as a signal is supplied through a pair of weak cross-coupled transistors, one each of which is disposed between the switched supply voltage and each of the first and second MEJs, causing a node at one end of each of said first and second MEJ to differentiate, resulting in the node with higher resistance latching high, while the node with lower resistance latching to ground;
   said transistor circuit having a precharge phase of a read operation in which the match line is precharged high and left floating during a subsequent evaluation phase;
   wherein search bits having a data bit and its complement are applied to the complementary source lines during an evaluation phase of content addressability in which the match line is pulled low in response to a mismatch, in which data searched for does not equal data stored in said CAM); and
   wherein it is not possible for the read operations performed during searching of said CAM apparatus to switch the MEJs, because writing of the MEJs in said CAM apparatus were performed with an opposite polarity as reading of the MEJs during search.

2. The apparatus recited in claim 1, wherein during the read operation magnetization orientation of each said MEJ is read by measuring electrical resistance through at least said two FM layers and said DE layer in response to tunneling magnetoresistance (TMR) properties.

3. The apparatus recited in claim 1, wherein said ferromagnetic layers comprise a CoFeB material.

4. The apparatus recited in claim 1, wherein said fixed layer comprises a $Co_{60}Fe_{20}B_{20}$ material.

5. The apparatus recited in claim 1, wherein said free layer comprises a $Co_{20}Fe_{60}B_{20}$ material.

6. The apparatus recited in claim 1, further comprising at least one layer adjacent said fixed ferromagnetic layer to provide antiferromagnetic inter-layer exchange coupling.

7. The apparatus recited in claim 1, further comprising at least one layer providing antiferromagnetic inter-layer exchange coupling.

8. The apparatus recited in claim 7, wherein said layer providing antiferromagnetic inter-layer exchange coupling comprises a Ruthenium (Ru) layer.

9. The apparatus recited in claim 1, further comprising at least one exchange biased layer whose magnetization is pinned by an exchange bias pinning layer.

10. The apparatus recited in claim 9, wherein said exchange biased layer comprises a CoFe material, and said exchange bias pinning layer comprises platinum-manganese (PtMn).

11. The apparatus recited in claim 1, wherein said dielectric material comprises MgO.

12. The apparatus recited in claim 1, wherein said CAM apparatus is fabricated with a complementary metal oxide semiconductor (CMOS) process below 90 nanometers.

13. The apparatus recited in claim 1, wherein each of said MEJs has a leakage current less than 10 microamps (µA).

14. The apparatus recited in claim 1, further comprising multiple pipeline stages, each stage comprising multiple CAM cells of said CAM apparatus.

15. The apparatus recited in claim 14, wherein a mismatch of searched for data and data contained in said CAMs in each said pipeline stage stops the search and shuts off power to succeeding stages.

16. The apparatus recited in claim 14, further comprising local and global match lines incorporated within a final stage of said multiple pipeline stages, toward overcoming unequal pipeline delays.

17. The apparatus recited in claim 14, wherein a match line is associated with each said stage of said multiple pipeline stages.

18. A voltage-controlled magnetic anisotropy (VCMA) magnetoelectric content addressable memory (CAM) apparatus, comprising:
   an array of magnetoelectric content addressable memory (CAM) cells, wherein each cell receives two word lines, a bit line, a match-line, complementary source lines, a switched supply voltage and ground;
   at least two complementary magnetoelectric tunnel junctions (MEJs), comprising a first MEJ and a second MEJ in each of said CAM cells, each MEJ having at least two ferromagnetic (FM) layers separated by a dielectric (DE) layer, and in which said at least two FM layers comprise at least an FM fixed layer and an FM free layer;

at least one layer adjacent said fixed ferromagnetic layer to provide antiferromagnetic inter-layer exchange coupling;
at least one layer providing antiferromagnetic inter-layer exchange coupling;
at least one exchange biased layer whose magnetization is pinned by an exchange bias pinning layer; and
a transistor circuit which during a write pulls the switched supply voltage low, with the first MEJ written in response to a switching voltage applied to the bit line and asserting a first word line, while the second MEJ is written by applying a complementary switching voltage to the bit line and asserting a second word line;
said transistor circuit during a read operation grounds the two word lines and the bit line while holing $V_{DD}$ high as a signal is supplied through a pair of weak cross-coupled transistors, one each of which is disposed between the switched supply voltage and each of the first and second MEJs, causing a node at one end of each of said first and second MEJ to differentiate, resulting in the node with higher resistance latching high, while the node with lower resistance latching to ground;
said transistor circuit having a precharge phase of a read operation in which the match line is precharged high and left floating during a subsequent evaluation phase;
wherein search bits having a data bit and its complement are applied to the complementary source lines during an evaluation phase of content addressability in which the match line is pulled low in response to a mismatch, in which data searched for does not equal data stored in said CAM); and
wherein it is not possible for the read operations performed during searching of said CAM apparatus to switch the MEJs, because writing of the MEJs in said CAM apparatus were performed with an opposite polarity as reading of the MEJs during search.

19. The apparatus recited in claim 18, further comprising:
multiple pipeline stages, each stage comprising multiple CAM cells of said CAM apparatus, with a match line is associated with each said stage of said multiple pipeline stages;
wherein a mismatch of searched for data and data contained in said CAMs in each said pipeline stage stops the search and shuts off power to succeeding stages; and
wherein a final stage of said pipeline comprises local and global match lines toward overcoming unequal pipeline delays.

20. A voltage-controlled magnetic anisotropy (VCMA) magnetoelectric content addressable memory (CAM) apparatus, comprising:
an array of magnetoelectric content addressable memory (CAM) cells, wherein each cell receives two word lines, a bit line, a match-line, complementary source lines, a switched supply voltage and ground;
at least two complementary magnetoelectric tunnel junctions (MEJs), comprising a first MEJ and a second MEJ in each of said CAM cells, each MEJ having at least two ferromagnetic (FM) layers separated by a dielectric (DE) layer, and in which said at least two FM layers comprise at least an FM fixed layer and an FM free layer; and
a transistor circuit which during a write pulls the switched supply voltage low, with the first MEJ written in response to a switching voltage applied to the bit line and asserting a first word line, while the second MEJ is written by applying a complementary switching voltage to the bit line and asserting a second word line;
said transistor circuit during a read operation grounds the two word lines and the bit line while holing $V_{DD}$ high as a signal is supplied through a pair of weak cross-coupled transistors, one each of which is disposed between the switched supply voltage and each of the first and second MEJs, causing a node at one end of each of said first and second MEJ to differentiate, resulting in the node with higher resistance latching high, while the node with lower resistance latching to ground;
said transistor circuit having a precharge phase of a read operation in which the match line is precharged high and left floating during a subsequent evaluation phase;
wherein search bits having a data bit and its complement are applied to the complementary source lines during an evaluation phase of content addressability in which the match line is pulled low in response to a mismatch, in which data searched for does not equal data stored in said CAM);
wherein it is not possible for the read operations performed during searching of said CAM apparatus to switch the MEJs, because writing of the MEJs in said CAM apparatus were performed with an opposite polarity as reading of the MEJs during search;
multiple pipeline stages, each stage comprising multiple CAM cells within said CAM apparatus, with a match line associated with each said stage of said multiple pipeline stages so that a mismatch of searched for data and data contained in said CAMs in each said pipeline stage stops the search and shuts off power to succeeding stages; and
wherein a final stage of said pipeline comprises local and global match lines toward overcoming unequal pipeline delays.

* * * * *